(12) United States Patent
Botker

(10) Patent No.: US 7,554,402 B2
(45) Date of Patent: Jun. 30, 2009

(54) HIGH CMR AMPLIFIER TOPOLOGY

(75) Inventor: Thomas L. Botker, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/982,558

(22) Filed: Nov. 1, 2007

(65) Prior Publication Data

US 2009/0115521 A1    May 7, 2009

(51) Int. Cl.
*H03F 3/45*    (2006.01)
(52) U.S. Cl. ........................... 330/258; 330/261
(58) Field of Classification Search ................ 330/258, 330/261, 257, 253
See application file for complete search history.

(56) References Cited

U.S. PATENT DOCUMENTS

| | | | | |
|---|---|---|---|---|
| 4,088,962 A | * | 5/1978 | Trilling | 330/261 |
| 4,272,728 A | * | 6/1981 | Wittlinger | 330/253 |
| 4,442,408 A | * | 4/1984 | Le | 330/261 |
| 5,276,405 A | * | 1/1994 | Mazzucco et al. | 330/257 |
| 5,642,062 A | * | 6/1997 | Kawakami | 327/66 |
| 6,661,288 B2 | * | 12/2003 | Morgan et al. | 330/258 |

\* cited by examiner

*Primary Examiner*—Henry K Choe
(74) *Attorney, Agent, or Firm*—Koppel, Patrick, Heybl & Dawson

(57) ABSTRACT

An amplifier topology includes an input stage comprising a differential pair which conducts respective output currents in response to a differential input signal. Bias current sources provide the pair's tail current and respective bias currents for the input stage in response to a drive voltage. After flowing through the input stage, most or all of the input stage bias currents are summed at a summing node, the summed currents being a current $I_{sum}$. The input stage also has a feedback loop which includes a bias generator circuit arranged to receive $I_{sum}$, and to provide the drive voltage to the bias current sources such that $I_{sum}$ is maintained approximately constant. By so doing, the output impedance of the bias current sources is effectively increased, which serves to improve the amplifier's CMR and PSR characteristics.

19 Claims, 2 Drawing Sheets

HIGH CMR AMPLIFIER TOPOLOGY

BACKGROUND OF THE INVENTION

1. Field of the Invention

This invention relates generally to operational amplifiers, and, more particularly, to means for improving the common mode (CMR) and power supply (PSR) rejection characteristics of such amplifiers.

2. Description of the Related Art

Operational amplifiers typically include an input stage built around a differential transistor pair biased with a tail current. The tail current, as well as other input stage bias currents, are typically provided with respective transistors, each of which is controlled with a drive voltage provided by a bias generator circuit.

However, the output impedances of the bias current transistors may not be particularly high. As such, variations in the amplifier's supply voltage and in the input common-mode voltage can cause the bias currents to vary, which serves to degrade the amplifier's CMR and PSR characteristics.

One method by which CMR and PSR can be improved is by connecting a cascode transistor or an output impedance boost amplifier in series with the bias current transistors; cascode transistors can also be added within the bias generator and/or the input stage. However, these added components require additional headroom, thereby increasing the amplifier's minimum supply voltage.

Many other biasing methods are known; several are described, for example, in "Analysis and Design of Analog Integrated Circuits"; Gray and Meyer, 3$^{rd}$ ed., pp. 310-311, 322-333, 422. However, most of these methods also exhibit less than ideal CMR/PSR characteristics, or require a considerable amount of headroom.

SUMMARY OF THE INVENTION

An amplifier topology is presented which overcomes the problems noted above, providing good CMR and PSR characteristics without requiring excessive headroom.

The present amplifier includes an input stage comprising first and second transistors arranged as a differential pair; the pair is biased with a tail current and conducts respective output currents in response to a differential input signal. The input stage includes bias current sources which provide respective bias currents for the input stage in response to a drive voltage, with one of the bias currents being the tail current. After flowing through the input stage, most or all of the input stage bias currents are summed at a summing node, the summed currents being a current $I_{sum}$.

The amplifier also includes a feedback loop. The loop includes a bias generator circuit which is connected to receive $I_{sum}$, and is arranged to provide the drive voltage to the bias current sources such that $I_{sum}$ is maintained approximately constant. By so doing, the output impedance of the bias current sources is effectively increased, which serves to improve the amplifier's CMR and PSR characteristics.

These and other features, aspects, and advantages of the present invention will become better understood with reference to the following drawings, description, and claims.

DETAILED DESCRIPTION OF THE INVENTION

The present amplifier topology includes an input stage biasing means which stabilizes the input stage bias currents by incorporating them into the bias generator through the use of a feedback loop, thereby improving the stage's CMR and PSR characteristics.

Figure 1:
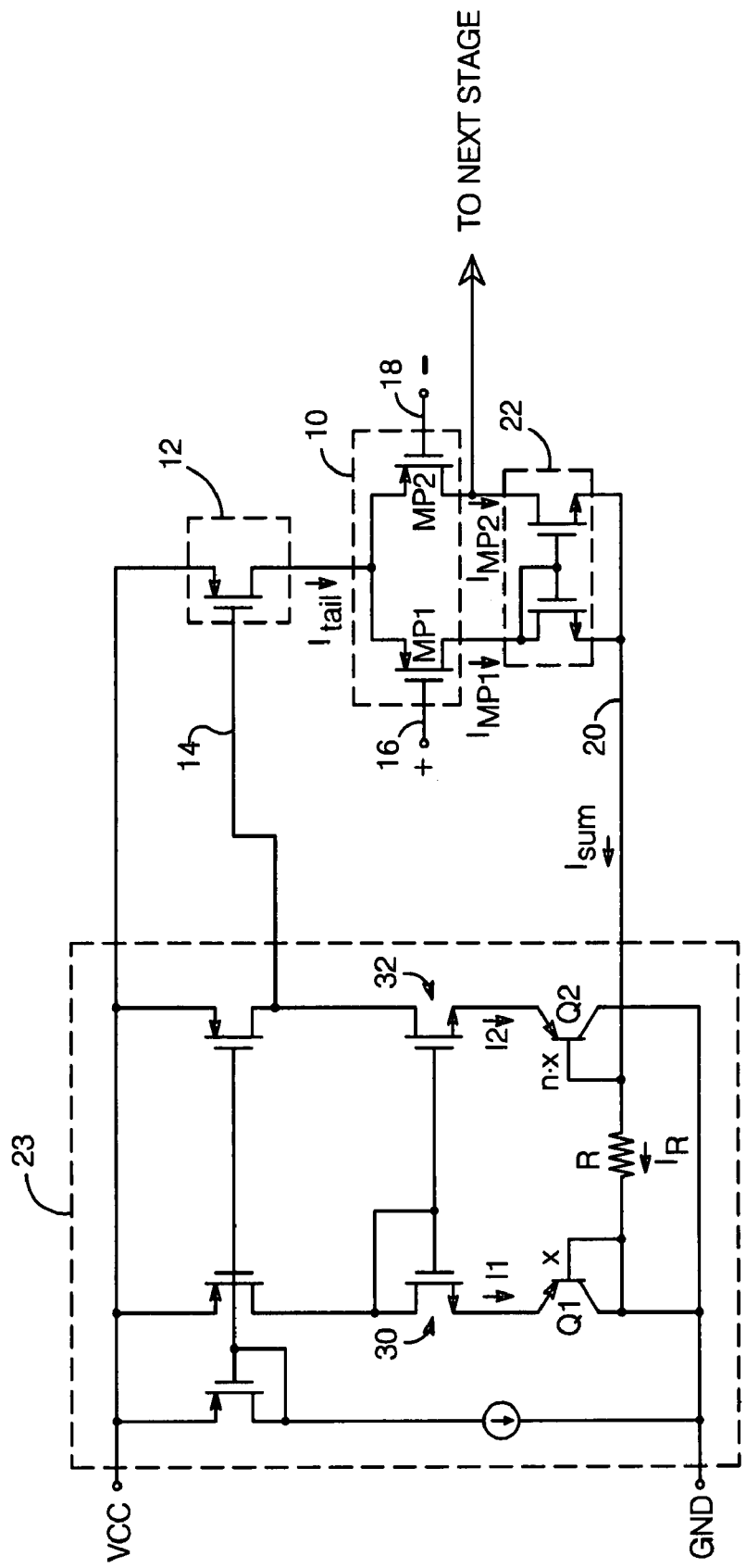
FIG. 1 is a schematic diagram illustrating the principles of a high CMR operational amplifier per one possible embodiment of the present invention.

FIG. 1 is a schematic diagram of an operational amplifier input stage which illustrates the basic principles of the invention. The input stage includes first and second transistors MP1 and MP2 connected as a differential pair 10. A current source 12 provides a tail current $I_{tail}$ to pair 10 in response to a drive voltage 14; current source 12 is typically implemented with a p-type transistor such as the PMOS FET shown in FIG. 1, though any circuit arrangement which provides an output current in response to a drive voltage could be used. Pair 10 is arranged to receive a differential input signal at respective inputs 16, 18, and to conduct respective output currents $I_{MP1}$, $I_{MP2}$ in response.

The amplifier is connected between a supply voltage (VCC) and a circuit common point (GND) (which is typically at ground potential but may also may be non-zero). The present input stage topology includes a summing node 20 at which most or all of the input stage bias currents are summed after flowing through the input stage; summing node 20 is required to be at a different potential than the GND node. In the exemplary embodiment shown in FIG. 1, differential pair output currents $I_{MP1}$, $I_{MP2}$ drive an active load 22, here comprising a current mirror. The current mirror is referred to summing node 20, such that all of the input stage bias currents—which in this example consists solely of $I_{tail}$—are returned to node 20 after flowing through the input stage. The resulting current at summing node 20 is referred to herein as $I_{sum}$.

The amplifier also includes a feedback loop; in this example, the loop comprises a bias generator circuit 23 arranged to receive $I_{sum}$, and to provide drive voltage 14 to the input stage bias current source (12) such that $I_{sum}$ is maintained approximately constant; bias generator circuit 23 may comprise, for example, a single or multi-stage amplifier with an offset voltage. By so doing, the output impedance of the bias current sources is effectively increased, which serves to improve the amplifier's CMR and PSR characteristics.

The feedback loop preferably operates by providing a fixed voltage across a resistance which is connected in series between $I_{sum}$ and GND, thereby maintaining $I_{sum}$ approximately constant. In the example shown in FIG. 1, resistance R is connected in series with $I_{sum}$ such that it conducts $I_{sum}$ to GND. A fixed voltage is provided across resistance R by means of two transistors conducting fixed currents, which may be equal or unequal. In the exemplary embodiment shown, first and second fixed currents I1 and I2 are provided to transistors Q1 and Q2, with resistance R connected between their respective bases, as well as between $I_{sum}$ and GND. Here, I1 and I2 are provided by the means shown; note that there are many other ways in which fixed currents could be generated.

Q1 and Q2 are connected such that Q1 conducts I1 and Q2 conducts I2. Q1 and Q2 have emitter areas x and n*x, respectively. When so arranged, the current $I_R$ through resistance R is given by:

$$I_R = \frac{Vt}{R}\ln\left(\frac{I1}{I2}n\right),$$

where Vt is the thermal voltage. The voltage $V_R$ across R is then given by $I_R*R$. To ensure that a non-zero voltage is applied across R, bias generator circuit 23 is arranged such that $$\left(\frac{I1}{I2}n\right) > 0.$$

Since I1 and I2 are fixed, $V_R$ will also be fixed. In this way $I_R$, and thereby $I_{sum}$, is maintained approximately constant and independent of input common-mode voltage or supply voltage, thereby improving the amplifier's CMR and PSR characteristics.

When the bias generator is arranged as shown in FIG. 1, it is preferably arranged such that I1≈I2 and n>1. For example, if I1=I2 and n=8, $I_R$ is given by:

$$I_R = \frac{Vt}{R}\ln(8) \approx \frac{54mv}{R}.$$

Resistance R can thus be selected to provide a desired value for $I_R$, and thus for $I_{sum}$.

Note that it is not required that I1=I2 or that n>1. To provide a fixed voltage across R, it is only required that $$\left(\frac{I1}{I2}n\right)$$

be greater than zero. Also note that, though transistors Q1 and Q2 are shown as bipolar transistors, FETs could also be used. Similarly, though MP1, MP2, current source 12 and active load 22 are shown implemented with FETs, bipolar transistors could also be used.

The feedback loop as implemented in FIG. 1 operates as follows: assume that the voltage applied to differential inputs 16 and 18 falls, causing MP1 and MP2 to pull down on their common source node. This increases the voltage across current source 12, causing the current source to provide the increased current demanded by MP1 and MP2. This increases $I_{sum}$, which is fed back to resistance R causing $I_R$ and the voltage $V_R$ across R to increase, thereby raising the voltage at the base of Q2. Q2 acts as a voltage follower, so that an increase at its base results in an increase at its emitter; this increase decreases the current in FET 32. As a result, drive voltage 14 increases, thereby causing the current from current source 12—i.e., $I_{tail}$—to decrease, thereby stabilizing the input stage's bias currents. The gain of the loop is given by $g_{m12}*R*g_{mQ2(eff)}*r_{out}$, where $g_{m12}$ is the transconductance of current source 12, $g_{mQ2(eff)}$ is the effective transconductance of Q2, and $r_{out}$ is the output resistance of node 14.

Figure 2:
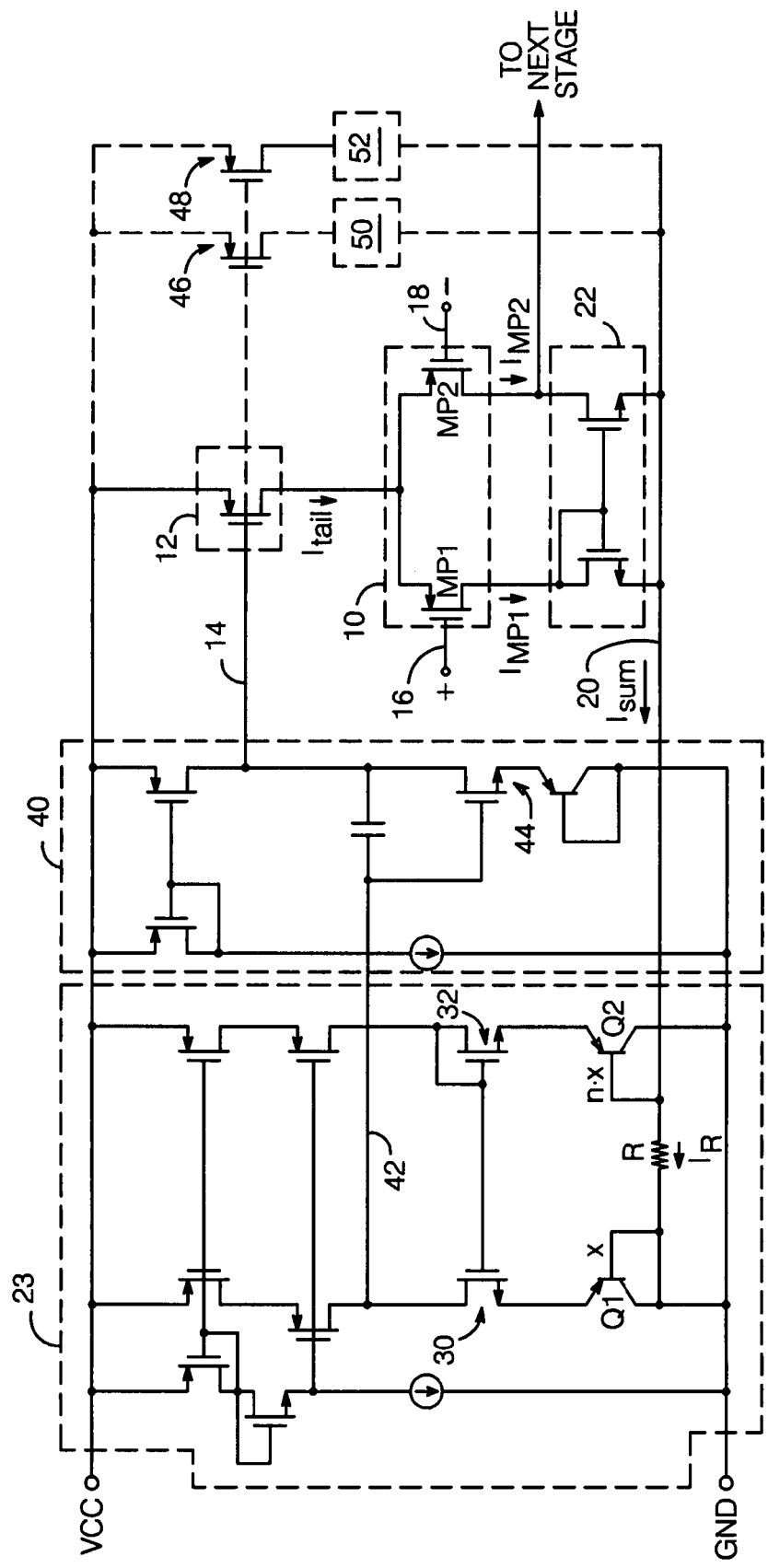
FIG. 2 is a schematic diagram of another embodiment of a high CMR operational amplifier per the present invention.

Another possible embodiment of an operational amplifier input stage per the present invention is shown in FIG. 2. Here, bias generator 23 includes an additional level of cascode transistors to better isolate the generator from power supply variations. The amplifier also includes a second stage 40, to provide additional gain. The second stage is driven by a drive signal 42, the voltage of which decreases when $I_{sum}$ increases, and vice versa. Drive signal 42 drives an NMOS FET 44, the drain of which provides drive voltage 14. FET 44 is biased such that, when $I_{sum}$ increases, FET 44 conducts less, causing drive voltage 14 to increase and $I_{tail}$ to fall, thereby stabilizing the input stage's bias currents.

In addition to driving the current source (12) which provides tail current to MP1 and MP2, drive voltage 14 can be used to drive additional input stage bias current sources, such as PMOS FETs 46 and 48, which bias additional input stage circuits (50, 52). To ensure that all the input stage bias currents are stabilized, the input stage should be arranged so that all of its bias currents are returned to summing node 20 and to resistance R, as shown in FIG. 2.

Some prior art bias generators also employ a fixed voltage across a resistance to generate bias currents. However, these schemes required a relatively large resistance to develop a voltage large enough to generate adequate bias currents. The present invention mitigates this problem by essentially recycling the input stage bias currents via the feedback loop. With this additional current ($I_{sum}$) contributing to the voltage developed across R, its resistance value can be much smaller than was previously needed. This is desirable, as a smaller resistance requires less die area.

Note that the invention does not require the use of a bias generator circuit implemented as shown in FIGS. 1 and 2. There are many other ways in which the bias generator could be implemented, as well as other ways in which a fixed voltage could be developed across a resistance.

Also note that, though the input stage is shown driving a current mirror used as an active load 22 in FIGS. 1 and 2, this is not required. However, a current mirror is preferred to avoid any other errors that might arise with other types of loads, such as a folded cascode.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An operational amplifier, comprising:
   an input stage, comprising:
      a differential transistor pair comprising first and second transistors, said pair biased with a tail current and arranged to receive a differential input signal at respective inputs and to conduct respective output currents in response; and
      at least one input stage bias current source, said input stage bias current sources providing respective bias currents for said input stage in response to a drive voltage, one of said bias currents being said tail current;
   a summing node at which at least some of said input stage bias currents are summed after flowing through said input stage, the current at said summing node being a current $I_{sum}$; and
   a feedback loop, comprising:
      a bias generator circuit arranged to receive $I_{sum}$ and to provide said drive voltage to said bias current sources such that $I_{sum}$ is maintained approximately constant;
   wherein said amplifier is powered by being connected between a supply voltage and a circuit common point, said bias generator including a means of providing a fixed voltage across a resistance R which is connected to conduct $I_{sum}$ between said summing node and said circuit common point such that $I_{sum}$ is maintained approximately constant.

2. The amplifier of claim 1, wherein said bias generator circuit comprises:
first and second current sources connected to provide respective fixed currents I1 and I2; and
third and fourth transistors connected between the outputs of said first and second current sources, respectively, and said circuit common point, such that said third transistor conducts I1 and said fourth transistor conducts I2, said third and fourth transistors having sizes x and n*x, respectively; and
a resistor having said resistance R connected at a first terminal to the control input of said fourth transistor and to said summing node and at a second terminal to said circuit common point;
such that the current $I_R$ through said resistor is given by:

$$I_R = \frac{Vt}{R} \ln\left(\frac{I1}{I2}n\right),$$

where Vt is the thermal voltage and said bias generator circuit is arranged such that $$\left(\frac{I1}{I2}n\right) > 0,$$

said feedback loop operating to maintain $I_R$ and thereby $I_{sum}$ approximately constant.

3. The amplifier of claim 2, wherein said first and second current sources are arranged such that I1 is approximately equal to I2 and n is greater than 1.

4. The amplifier of claim 2, wherein said third and fourth transistors are bipolar transistors.

5. The amplifier of claim 1, further comprising an active load which is driven by said differential pair's output currents and is connected between said differential pair's output currents and said summing node.

6. The amplifier of claim 5, wherein said active load comprises a current mirror.

7. The amplifier of claim 1, wherein said input stage bias current sources comprise respective p-type transistors.

8. The amplifier of claim 7, wherein said input stage bias current sources comprise respective PMOS field-effect transistors (FETs), the gates of which receive said drive voltage.

9. The amplifier of claim 7, wherein said input stage bias current sources comprise respective PNP transistors, the bases of which receive said drive voltage.

10. The amplifier of claim 7, wherein said bias generator includes at least one node which decreases when $I_{sum}$ increases and vice versa, said at least one node providing said drive voltage to said p-type.

11. The amplifier of claim 1, wherein said amplifier is a single stage amplifier.

12. The amplifier of claim 1, wherein said amplifier is a multistage amplifier.

13. The amplifier of claim 1, wherein said amplifier is arranged such that all of said input stage bias currents are summed at said summing node after flowing through said input stage.

14. The amplifier of claim 1, wherein said bias generator is a single stage amplifier.

15. The amplifier of claim 1, wherein said bias generator is a multistage amplifier.

16. The amplifier of claim 6, wherein said active load comprises a current mirror made from NMOS field-effect transistors (FETs)

17. The amplifier of claim 6, wherein said active load comprises a current mirror made from NPN bipolar transistors.

18. The amplifier of claim 2, wherein said first and second current sources comprise:
a fixed current source;
a first current mirror which mirrors the output of said fixed current source to a first node;
a second current mirror which mirrors the output of said fixed current source to a second node;
a fifth transistor connected to conduct the output of said first current mirror between said first node and said third transistor, the current conducted by said fifth transistor being I1;
a sixth transistor connected to conduct the output of said second current mirror between said second node and said fourth transistor, the current conducted by said sixth transistor being I2, the control inputs of said fifth and sixth transistors connected together;
said drive voltage provided at said second node.

19. The amplifier of claim 2, wherein said first and second current sources comprise:
a fixed current source;
a fifth transistor, said fifth transistor being diode connected and connected to conduct the output of said fixed current source;
a first current mirror which mirrors the output of said fifth transistor to a first node;
a second current mirror which mirrors the output of said fifth transistor to a second node;
a sixth transistor connected to conduct the output of said first current mirror between said first node and a third node;
a seventh transistor connected to conduct the output of said second current mirror between said second node and a fourth node, the control inputs of said sixth and seventh transistors connected together and to the output of said fixed current source;
an eighth transistor connected to conduct the current at said third node to said third transistor, said current conducted by said eighth transistor being I1;
a ninth transistor, said ninth transistor being diode-connected and connected to conduct the current at said fourth node to said fourth transistor, said current conducted by said ninth transistor being I2, the control inputs of said eighth and ninth transistors connected together;
said drive voltage provided at said third node.

* * * * *